(12) United States Patent
Sheng et al.

(10) Patent No.: US 7,440,249 B2
(45) Date of Patent: Oct. 21, 2008

(54) UNDERVOLTAGE DETECTION CIRCUIT

(75) Inventors: Wenjun Sheng, Austin, TX (US); Xiaoyu Xi, Plano, TX (US)

(73) Assignee: Silicon Laboratories, Inc., Austin, TX (US)

( * ) Notice: Subject to any disclaimer, the term of this patent is extended or adjusted under 35 U.S.C. 154(b) by 360 days.

(21) Appl. No.: 11/094,610

(22) Filed: Mar. 30, 2005

(65) Prior Publication Data

US 2006/0227477 A1   Oct. 12, 2006

(51) Int. Cl.
*H02H 3/24* (2006.01)

(52) U.S. Cl. .................. 361/92; 323/313; 323/314; 323/315

(58) Field of Classification Search .................. 327/539; 323/313–315; 361/92
See application file for complete search history.

(56) References Cited

U.S. PATENT DOCUMENTS

| | | | |
|---|---|---|---|
| 5,747,978 A | | 5/1998 | Gariboldi |
| 6,002,245 A | * | 12/1999 | Sauer ................... 323/315 |
| 6,204,706 B1 | * | 3/2001 | Horvath ................ 327/198 |
| 6,549,065 B2 | | 4/2003 | Opris |
| 6,642,778 B2 | | 11/2003 | Opris |
| 6,842,321 B2 | | 1/2005 | Brohlin |
| 6,989,708 B2 | * | 1/2006 | Xi ....................... 327/539 |
| 6,995,587 B2 | | 2/2006 | Xi |
| 7,075,282 B2 | * | 7/2006 | Feng .................... 323/313 |
| 2003/0067304 A1 | | 4/2003 | Miyagi |
| 2005/0035812 A1 | | 2/2005 | Xi |

OTHER PUBLICATIONS

Razavi, Behad, Professor of Electrical Engineering, University of California, Los Angeles "Design of Analog CMOS Integrated Circuits" 2001, Chapter 11 p. 380-393, McGraw-Hill Series in Electrical and Computer Engineering, McGraw-Hill Book Co.
International Preliminary Report on Patentability; International Application No. PCT/US2006/011696; International Filing Date Mar. 30, 2006; Authorized Officer Philippe Becamel; Date of Issuance of Report: Oct. 3, 2007.
International search report application No. PCT/US2006/011696 mailed Aug. 3, 2006.

* cited by examiner

*Primary Examiner*—Michael J Sherry
*Assistant Examiner*—Tien Mai
(74) *Attorney, Agent, or Firm*—Meyertons Hood Kivlin Kowert & Goetzel, P.C.; B. Noël Kivlin; Stephen J. Curran

(57) ABSTRACT

An undervoltage detection circuit includes a first transistor and a second transistor coupled to a supply voltage node and arranged to form a current mirror. The undervoltage detection circuit also includes a first bipolar transistor and a second bipolar transistor. A collector of the first bipolar transistor is coupled to the first transistor, and an emitter of the first bipolar transistor is coupled to a reference voltage node. A collector of the second bipolar transistor is coupled to the second transistor and an emitter of the second bipolar transistor is coupled to the reference voltage node through a first resistor. The undervoltage detection circuit further includes a third transistor coupled through a second resistor to an input voltage node. An output signal indicative of an input voltage is derived from a voltage established at the collector of the second bipolar transistor.

19 Claims, 2 Drawing Sheets

UNDERVOLTAGE DETECTION CIRCUIT

BACKGROUND OF THE INVENTION

1. Field of the Invention

This invention relates to detection circuits and, more particularly, to undervoltage detection circuits and undervoltage lockout circuits.

2. Description of the Related Art

Many circuits are sensitive to fluctuations in supply voltage. More particularly, when the supply voltage decrease below a minimum specified operating voltage, an undervoltage condition may occur. Some circuits may either be damaged or they may exhibit unpredictable operation when operated in an undervoltage condition. The unpredictable operation may be especially critical in circuits that include processing engines such as microprocessors, microcontrollers, and digital signal processors, for example.

Depending on the type of system, there may be various reasons for undervoltage events. In a typical battery-operated system such as a portable communication or computing device, for example, the charge (and thus the voltage potential) stored in the battery will inevitably decay. To prevent damage or unpredictable circuit operation, it may be desirable to disable circuit operation during undervoltage events.

Some systems may employ an undervoltage detection/lockout circuit to prevent operation of system circuits during undervoltage conditions. In such systems, the detection/lockout circuit may enable the system circuits to operate while the battery voltage is above a predetermined threshold voltage and may disable the system circuits when the battery voltage drops below the threshold voltage. Some conventional undervoltage detection/lockout circuits employ a bandgap circuit for generating a temperature independent reference voltage and a separate comparator circuit for comparing the bandgap reference voltage to a voltage divided representation of the battery voltage. Unfortunately, these conventional implementations of undervoltage lockout circuits may utilize a relatively large amount of circuitry (e.g., and thus circuit area) and/or may consume a relatively large amount of power during operation.

SUMMARY

Various embodiments of an undervoltage detection circuit are disclosed. In one embodiment, the undervoltage detection circuit includes a first transistor and a second transistor coupled to a supply voltage node and arranged to form a current mirror. The undervoltage detection circuit also includes a first bipolar transistor and a second bipolar transistor. A collector of the first bipolar transistor is coupled to the first transistor and an emitter of the first bipolar transistor is coupled to a reference voltage node. A collector of the second bipolar transistor is coupled to the second transistor and an emitter of the second bipolar transistor is coupled to the reference voltage node through a first resistor. The undervoltage detection circuit further includes a third transistor coupled through a second resistor to an input voltage node. A node between the third transistor and the second resistor is coupled to provide a voltage corresponding to an input voltage to a base of the first bipolar transistor. An output signal indicative of the input voltage is derived from a voltage established at the collector of the second bipolar transistor.

In one specific implementation, the output signal may correspond to a first logic level established in response to the input voltage decreasing below a threshold voltage. In addition, the output signal may correspond to a second logic level established in response to the input voltage increasing above a threshold voltage.

In yet another specific implementation, the first bipolar transistor and the second bipolar transistor may be arranged to form a bandgap reference. In this implementation, the second bipolar transistor may have an area that is larger than an area of the first bipolar transistor and a current density that may be greater than a current density of the first bipolar transistor.

Figure 1:
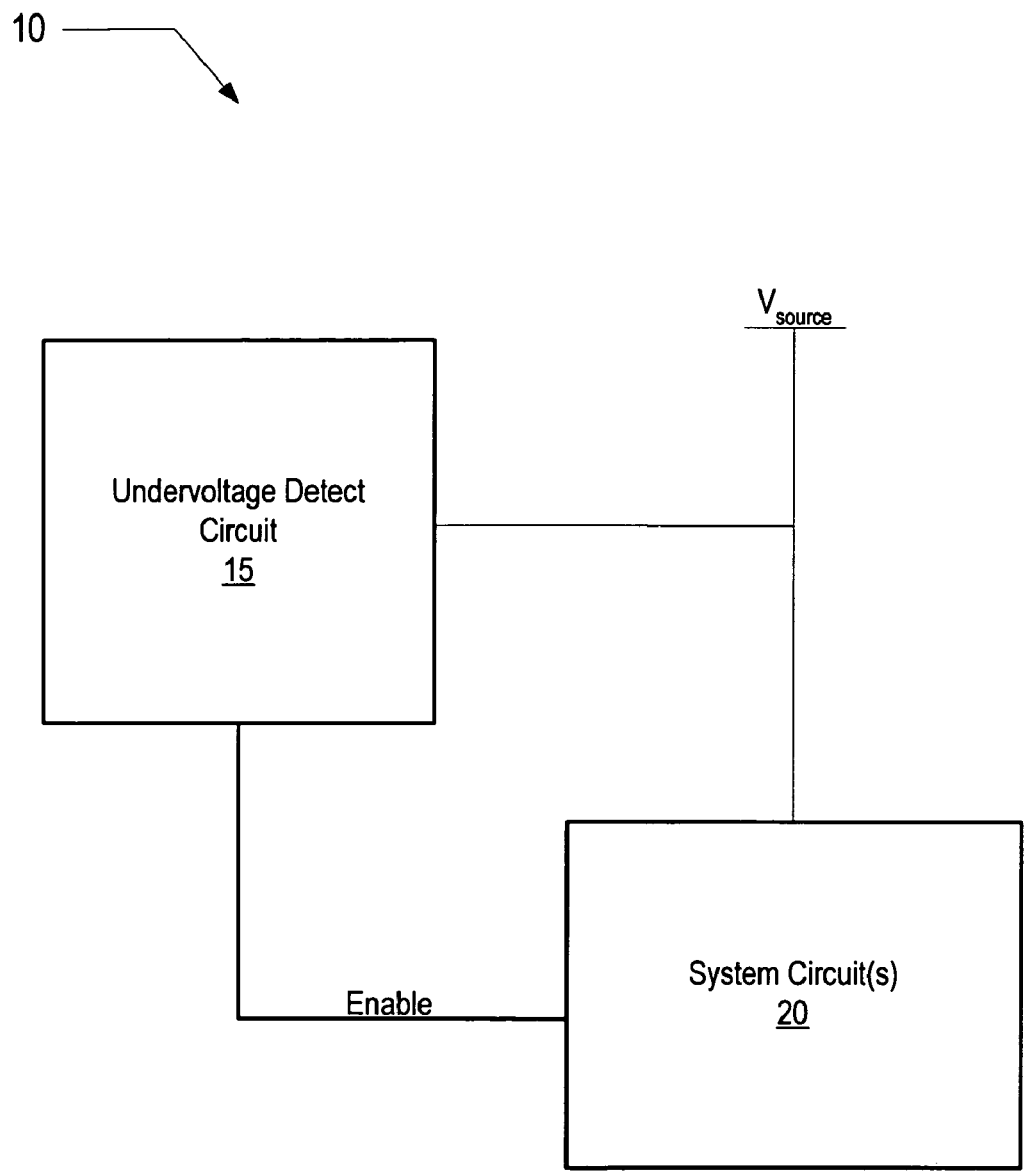
FIG. 1 is a block diagram illustrating a system including one embodiment of an undervoltage detection circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION

Turning now to FIG. 1, a block diagram of a system including one embodiment of an undervoltage detection circuit 15 is shown. The system 10 includes an undervoltage detection circuit 15 and system circuit(s) 20, each of which are coupled to a voltage source designated $V_{source}$. Undervoltage detection circuit 15 is also coupled to system circuit(s) 20 via an enable signal. System circuit(s) 20 is illustrative of any specific type of circuit, and may provide any particular functionality, as desired. In one particular embodiment, system circuit(s) 20 may form circuitry of a wireless communication device such as a cellular telephone (e.g., an RF transceiver or RF apparatus). In various embodiments, the voltage source $V_{source}$ may be derived from a battery, either directly or indirectly, for example, via a voltage regulator.

In various embodiments, the enable signal may correspond to a logic level of either a logic one or a logic zero. In one specific implementation, the enable signal may be an active low signal. Accordingly, a logic zero may enable operation of one or more circuits forming system circuit(s) 20. More particularly, undervoltage detection circuit 15 may be configured to provide an asserted enable signal as long as $V_{source}$ is maintained above a predetermined voltage. However, if $V_{source}$ falls below the predetermined voltage, undervoltage detection circuit 15 may cause the enable signal to be deasserted, thereby disabling operation of the one or more circuits within system circuit(s) 20. In such embodiments, undervoltage detection circuit 15 embodies an undervoltage lockout circuit. It is noted that in other implementations, the enable signal may be an active high signal. As such, a logic one may enable operation of the one or more circuits within system circuit(s) 20.

In one embodiment, system 10 may be implemented on a single semiconductor integrated circuit (IC) chip. As such, undervoltage detection circuit 15 may prevent the IC from powering up by disabling system circuits 20 while the battery voltage is below the predetermined voltage. It is contemplated that in other various embodiments, undervoltage detection circuit 15 and system circuit(s) 20 may be formed on separate integrated circuits or using discrete circuits, or a combination thereof, as desired.

Figure 2:
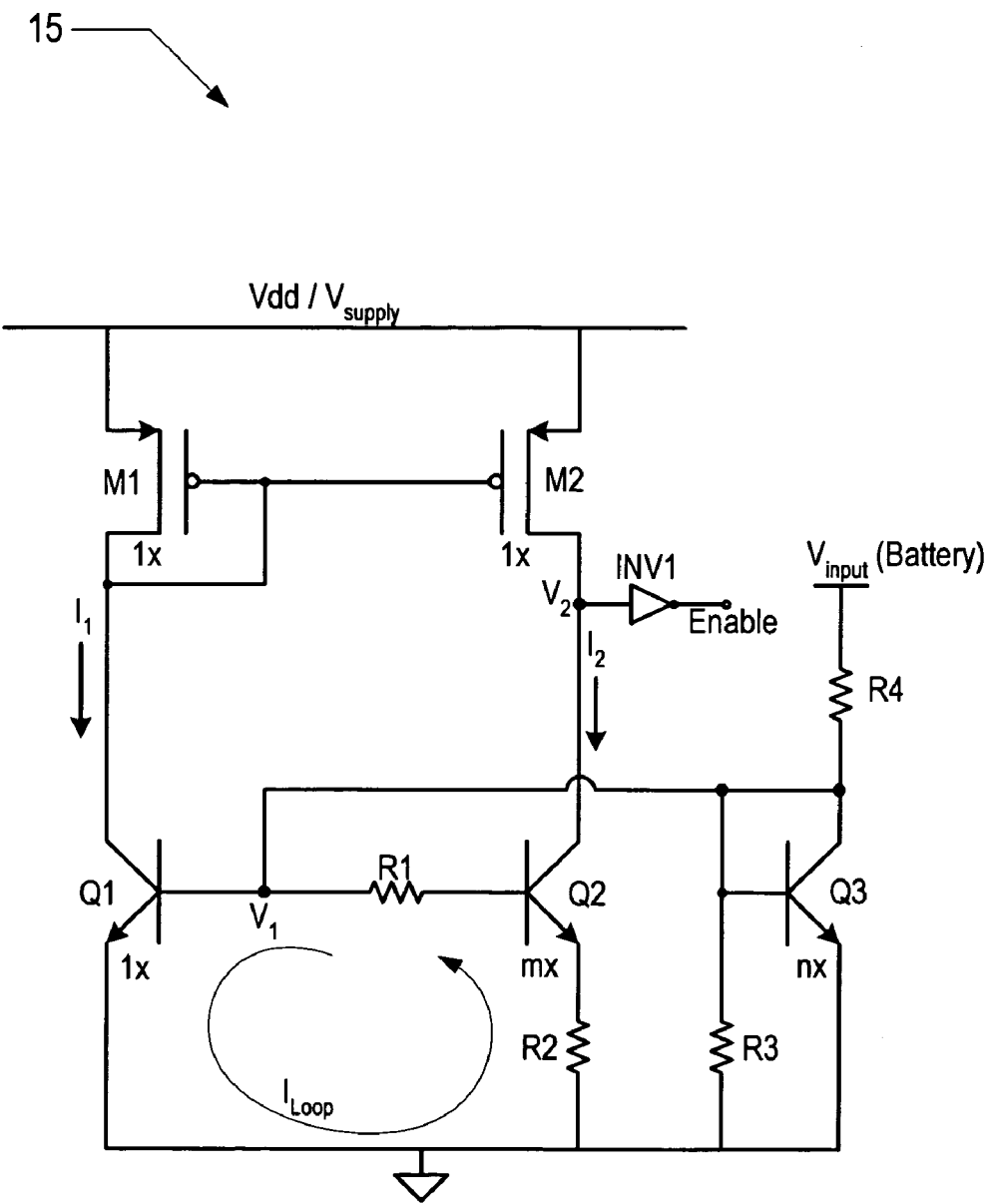
FIG. 2 is a schematic representation of one embodiment of the undervoltage detection circuit shown in FIG. 1.

Referring to FIG. 2, a schematic representation of one embodiment of the undervoltage detect circuit of FIG. 1 is shown. The undervoltage detection circuit 15 includes a pair of positive metal oxide semiconductor (PMOS) transistors designated M1 and M2 and three bipolar NPN transistors designated Q1, Q2, and Q3. In addition, undervoltage detection circuit 15 includes four resistors designated R1 through R4 and an inverter designated INV1. It is noted that in other embodiments inverter INV1 may be replaced by other logic/components such as a non-inverting buffer, for example.

In the illustrated embodiment, the drain of each of transistors M1 and M2 is coupled to Vdd/$V_{supply}$. M1 and M2 are arranged in a current mirror configuration. As such, the gates are coupled together and to the source of M1. In addition, transistors Q1 and Q2 are coupled to M1 and M2 in a common emitter configuration. In this configuration, the emitter of Q1 is coupled to the circuit ground reference node and the emitter of Q2 is coupled to the circuit ground reference node through resistor R2. Further, the collector of Q1 is coupled to the source of M1, while the collector of Q2 is coupled to the source of M2.

It is noted that Q1 and Q2 are further interconnected to establish a bandgap reference. Thus, the base of Q1 is coupled to the base of Q2 through a resistor R1. As will be described in greater detail below, when Q1 and Q2 are configured to establish the bandgap reference, they provide a reference voltage that may be stabilized (i.e., relatively constant) with respect to variations in temperature.

Transistor Q3 is also connected in a common emitter configuration to $V_{source}$. In this configuration, the emitter of Q3 is coupled to the circuit ground reference node. The collector of Q3 is coupled to $V_{input}$ through a resistor R4, while the base of Q3 is coupled to the collector of Q3 and to the circuit ground reference node through resistor R3. It is noted that transistor Q3, and resistors R3 and R4 form a voltage divider. The node between R4 and the collector of Q3 is coupled to the base terminal of Q1.

In one embodiment, the voltage labeled as Vdd/$V_{supply}$ may be a voltage derived either directly or indirectly (e.g., through voltage regulation) from a voltage such as $V_{source}$ of FIG. 1. Likewise, the voltage $V_{input}$ may be a voltage derived either directly or indirectly from $V_{source}$. In other embodiments, Vdd/$V_{supply}$ and $V_{input}$ may be the same node and thus the same voltage. Further, as described above, since $V_{source}$ may be provided by a battery $V_{input}$ is designated as a battery voltage.

Referring collectively, to FIG. 1 and FIG. 2, undervoltage detection circuit 15 is configured to provide an output enable that is indicative of whether the $V_{source}$ is above or below a given threshold voltage. Accordingly, in the embodiment of FIG. 2, the threshold voltage is a source voltage ($V_{InEq}$) at which an equilibrium may be established in the undervoltage detection circuit 15.

Various circuit parameters contribute to the establishment of the equilibrium voltage. For example, as illustrated in FIG. 2, transistors M1 and M2 are manufactured to be substantially the same size relative to each other, as denoted by the 1x reference designator. In addition, transistors M1 and M2 are arranged in a current mirror configuration that during operation, will attempt to keep the current I1 equal to the current I2 at equilibrium.

In contrast, transistors Q2 and Q3 are manufactured to have different sizes and therefore to have different current densities than transistor Q1, as denoted by the designations mx, nx, and 1x, respectively. In one embodiment, both Q2 and Q3 are larger than and therefore have greater current densities than Q1.

Accordingly, equilibrium may be reached when the emitter/base voltage of Q3 is substantially equal to the emitter/base voltage of Q1. In the illustrated embodiment, transistor Q3 and resistor R4 form a voltage divider circuit which divides down $V_{input}$. The voltage developed at the node between R4 and the collector of Q3 is the emitter/base voltage of Q3. Thus, when the voltage at this node is substantially the same as the emitter/base voltage of Q1, currents I1 and I2 will be substantially the same. In addition, at equilibrium the voltage at the collector of Q2 is somewhere between Vdd and Ground.

However as described further below, when the voltage developed at the node between R4 and the collector of Q3 is above a voltage that corresponds to the equilibrium supply voltage $V_{InEq}$, the voltage at the collector of Q2 will drive toward the Vdd rail causing the enable signal at the output of INV1 to go to a logic low value. Similarly, when the voltage developed at the node between R4 and the collector of Q3 is below a voltage that corresponds to $V_{InEq}$, the voltage at the collector of Q2 will drive toward the Ground potential causing the enable signal at the output of INV1 to go to a logic high value. It is noted that a relatively small change in the $V_{input}$ above or below $V_{InEq}$ may drive the voltage at the collector of Q2 to either the Vdd rail or to Ground potential.

At equilibrium, I1=I2 thus for the current loop $I_{Loop}$ the voltage equation is $V_{BE1}-V_{BE2}-(I_B+I_C)R_2-I_BR_1=0$. Since I1=I2 and Q1 and Q2 have different current densities, the difference between $V_{BE1}$ and $V_{BE2}=V_t$ ln m, which is the bandgap reference voltage. Thus, if $V_{BE1}-V_{BE2}=\Delta V_{BE1,2}$, then $\Delta V_{BE1,2}=V_t$ ln m=$(I_B+I_C)R_2+I_BR_1=I_B(R_1+R_2)+I_CR_2$. Further, the node voltage equation at the node between R4 and the collector of Q3 is $$I_{R4} = 2I_B + n(I_B + I_C) + \left(\frac{V_{BE}}{R_3}\right),$$

which reduces to $$I_{R4} = (2+n)I_B + nI_C + \left(\frac{V_{BE}}{R_3}\right).$$

Now, $V_{InEq}=I_{R4}R_4+V_{BE}$, which using substitution of $I_{R4}$ becomes $$I_{R4} \text{ becomes} = [(2+n)I_B + nI_C]R_4 + V_{BE}\left(1 + \frac{R_4}{R_3}\right).$$

If $$\frac{2}{n} = \frac{R_1}{R_2},$$

and substituting, then $$\Delta V_{BE1,2} = V_t \ln m$$
$$= \left[I_B\left(1 + \frac{R_1}{R_2}\right) + I_C\right]R_2$$
$$= \left[I_B\left(1 + \frac{2}{n}\right) + I_C\right]R_2$$
$$= [I_B(2+n) + I_C n]\frac{R_2}{n},$$

which further reduces to $$\frac{V_t \ln m}{R_2}n = I_B(2+n) + I_C n.$$

Thus, $$V_{InEq} = I_{R4}R_4 + V_{BE} = n\frac{R_4}{R_2}V_t \ln m + V_{BE}\left(\frac{R_4}{R_3} + 1\right).$$

This last equation represents a $1^{st}$ order accurate voltage that is proportional to the bandgap voltage. As shown, the bandgap reference includes a voltage that has positive temperature coefficient (Vt ln m) and a voltage that has a negative temperature coefficient ($V_{BE}$). Thus the voltage $V_{input}$, at which the circuit is at equilibrium, may vary only slightly with changes in temperature.

As described above, when $V_{input} > V_{InEq}$ (i.e., the voltage developed at the node between R4 and the collector of Q3 is above a voltage that corresponds to $V_{InEq}$), $V_{BE1}$ will be greater than it was at equilibrium causing Q1 to conduct more collector to emitter current. If Q1 conducts more current, the voltage at the collector of Q1 will decrease and I1 will be greater than I2. Since this voltage is the gate voltage of both PMOS transistors of the current mirror, M1 and M2 will conduct more current in an attempt to increase both I1 and I2. However, since the increase in $V_{BE2}$ is much smaller than the increase in $V_{BE1}$, there is only a small increase in the collector to emitter current of Q2. Thus, the collector of Q2, and hence the node at V2 is seen as a high impedance by M2. As M2 of the current mirror attempts to increase I2, the voltage drop across M2 decreases and the voltage at the collector of Q2 will increase to the Vdd Rail. This will cause the enable signal at the output of INV1 to drive to a logic zero.

Conversely, when $V_{input} < V_{InEq}$ (i.e., the voltage developed at the node between R4 and the collector of Q3 is below a voltage that corresponds to $V_{InEq}$), $V_{BE1}$ will be less than it was at equilibrium causing Q1 to conduct less collector to emitter current. If Q1 conducts less current, the voltage at the collector of Q1 will increase and I1<I2. The increase in the voltage at the collector of Q1 causes M1 and M2 to conduct less current in an attempt to also decrease I2. However, since the decrease in $V_{BE2}$ is much smaller than the decrease in $V_{BE1}$, Q2 is still conducting with only a small change in I2.

Thus, if M2 is conducting less current and Q2 is still trying to conduct nearly the same as before, the voltage at the collector of Q2 will decrease to the Ground potential. This will cause the enable signal at the output of INV1 to go to a logic one.

It is noted that undervoltage detection circuit 15 may provide an integrated reference voltage (e.g., bandgap reference) without using a conventional closed-loop bandgap reference circuit for comparison to $V_{source}$. In addition, the arrangement of the current mirror and bandgap reference within undervoltage detection circuit 15 may allow the use of the parasitic bipolar devices available in many common CMOS processes.

It is further noted that in various other embodiments, undervoltage detection circuit 15 may provide functionality other than that of an undervoltage lockout circuit. For example, in some embodiments, undervoltage detection circuit 15 may be used as part of a power management system to invoke certain power management functionality upon detection of a low-voltage condition. In other embodiments, undervoltage detection circuit 15 may be used to provide a low battery indication or low-voltage warning, for example.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An undervoltage detection circuit comprising:
   a first transistor and a second transistor coupled to a supply voltage node and arranged to form a current mirror;
   a first bipolar transistor having a collector coupled to the first transistor and an emitter coupled to a reference voltage node;
   a second bipolar transistor having a collector coupled to the second transistor and an emitter coupled to the reference voltage node through a first resistor;
   a third transistor coupled through a second resistor to an input voltage node, wherein a node between the third transistor and the second resistor is coupled to provide a voltage corresponding to an input voltage to a base of the first bipolar transistor;
   a third resistor coupled between the base of the first bipolar transistor and a base of the second bipolar transistor; and
   a fourth resistor coupled between the reference voltage node and the base of the third transistor;
   wherein an output signal indicative of the input voltage is derived from a voltage established at the collector of the second bipolar transistor.

2. The circuit as recited in claim 1, wherein the first bipolar transistor and the second bipolar transistor are arranged to establish a bandgap reference, wherein the second bipolar transistor has an area that is larger than an area of the first bipolar transistor and a current density that is greater than a current density of the first bipolar transistor.

3. The circuit as recited in claim 1, wherein the output signal corresponds to a first logic level established in response to the input voltage decreasing below a threshold voltage.

4. The circuit as recited in claim 3, wherein the output signal corresponds to a second logic level established in response to the input voltage increasing above a threshold voltage.

5. The circuit as recited in claim 1, further comprising an inverter circuit coupled to the collector of the second bipolar transistor and configured to provide an output enable signal dependent upon the output signal.

6. The circuit as recited in claim 1, wherein the first transistor and the second transistor are metal oxide semiconductor transistors.

7. The circuit as recited in claim 1, wherein the third transistor is a bipolar transistor having an area that is larger than an area of the first bipolar transistor and a current density that is greater than a current density of the first bipolar transistor.

8. The circuit as recited in claim 7, wherein a base of the third bipolar transistor is coupled to a collector of the third transistor.

9. The circuit as recited in claim 1, wherein an emitter of the third bipolar transistor is coupled to the reference voltage node.

10. The circuit as recited in claim 1, wherein the input voltage is provided from a battery, and wherein the supply voltage is derived from the input voltage.

11. The circuit as recited in claim 1, wherein the reference voltage node is at circuit ground potential.

12. A system comprising:
one or more system circuits coupled to operate from an input voltage; and an undervoltage detection circuit coupled to the one or more system circuits,
wherein the undervoltage detect circuit includes:
a first transistor and a second transistor coupled to a supply voltage node and arranged to form a current mirror;
a first bipolar transistor having a collector coupled to the first transistor and an emitter coupled to a reference voltage node;
a second bipolar transistor having a collector coupled to the second transistor and an emitter coupled to the reference voltage node through a first resistor; and
a third transistor coupled through a second resistor to an input voltage node, wherein a node between the third transistor and the second resistor is coupled to provide a voltage corresponding to an input voltage to a base of the first bipolar transistor;
a third resistor coupled between the base of the first bipolar transistor and a base of the second bipolar transistor; and
a fourth resistor coupled between the reference voltage node and the base of the third transistor;
wherein an output enable signal indicative of the input voltage is derived from a voltage established at the collector of the second bipolar transistor.

13. The system as recited in claim 12, wherein the output enable signal corresponds to a first logic level in response to the input voltage decreasing below a threshold voltage.

14. The system as recited in claim 13, wherein the one or more system circuits are disabled in response to receiving an output enable signal corresponding to the first logic level.

15. The system as recited in claim 13, wherein the output enable signal corresponds to a second logic level in response to the input voltage increasing above a threshold voltage.

16. The system as recited in claim 15, wherein the one or more system circuits are enabled in response to receiving an output enable signal corresponding to the second logic level.

17. The system as recited in claim 12, wherein the first bipolar transistor and the second bipolar transistor are arranged to establish a bandgap reference, wherein the second bipolar transistor has an area that is larger than an area of the first bipolar transistor and a current density that is greater than a current density of the first bipolar transistor.

18. The system as recited in claim 12, wherein the third transistor is a bipolar transistor having an area that is larger than an area of the first bipolar transistor and a current density that is greater than a current density of the first bipolar transistor.

19. The system as recited in claim 18, wherein a base of the third transistor is coupled to a collector of the third transistor.

* * * * *